(12) United States Patent
Pezeshki et al.

(10) Patent No.: US 6,795,453 B2
(45) Date of Patent: Sep. 21, 2004

(54) LASER THERMAL TUNING

(75) Inventors: Bardia Pezeshki, Redwood City, CA (US); Ed Vail, Fremont, CA (US); Gideon Yoffe, Palo Alto, CA (US)

(73) Assignee: Santur Corporation, Fremont, CA (US)

( * ) Notice: Subject to any disclaimer, the term of this patent is extended or adjusted under 35 U.S.C. 154(b) by 251 days.

(21) Appl. No.: 10/000,141

(22) Filed: Oct. 30, 2001

(65) Prior Publication Data

US 2002/0090011 A1 Jul. 11, 2002

Related U.S. Application Data

(60) Provisional application No. 60/307,484, filed on Jul. 24, 2001, and provisional application No. 60/244,644, filed on Oct. 30, 2000.

(51) Int. Cl.[7] .............................. H01S 3/10; H01S 3/00; H01S 5/00; H01S 3/03; H01S 3/14
(52) U.S. Cl. .............................. 372/20; 372/23; 372/46; 372/64; 372/68; 372/38.02; 372/38.07
(58) Field of Search .............................. 372/20, 23, 43, 372/46, 64, 68, 81, 38.02, 38.07

(56) References Cited

U.S. PATENT DOCUMENTS

| | | |
|---|---|---|
| 3,924,937 A | 12/1975 | Munroe et al. |
| 4,359,773 A | 11/1982 | Swartz et al. |
| 4,498,730 A | 2/1985 | Tanaka et al. |
| 4,820,899 A | 4/1989 | Hikima et al. |
| 5,136,598 A | 8/1992 | Weller et al. |
| 5,274,489 A | 12/1993 | Smith et al. |
| 5,283,796 A | 2/1994 | Fink |
| 5,289,485 A | 2/1994 | Mooradian |
| 5,291,502 A | 3/1994 | Pezeshki et al. |
| 5,378,330 A | 1/1995 | Li et al. |
| 5,379,310 A | 1/1995 | Papen et al. |

(List continued on next page.)

FOREIGN PATENT DOCUMENTS

| | | |
|---|---|---|
| EP | 0924821 A1 | 6/1999 |
| FR | 2805092 | 8/2001 |
| JP | 56060088 | 5/1981 |
| JP | 11326707 | 11/1999 |
| JP | 2002246699 | 8/2002 |
| WO | WO 95/13638 | 5/1995 |
| WO | WO 02/13343 A2 | 2/2002 |
| WO | WO 02/37069 A1 | 5/2002 |
| WO | WO 02/37621 A2 | 5/2002 |
| WO | WO 02/058197 A2 | 7/2002 |
| WO | WO 02/013343 A3 | 7/2003 |

OTHER PUBLICATIONS

International Search Report dated Nov. 1, 2002 for International Application No. PCT/US01/45691 and mailed Jan. 6, 2003 (3 pages).

(List continued on next page.)

*Primary Examiner*—Don Wong
*Assistant Examiner*—Armando Rodriguez
(74) *Attorney, Agent, or Firm*—Christie, Parker & Hale, LLP

(57) ABSTRACT

A multi-wavelength laser array where each element can be individually heated for fine tuning. The wavelength of the array can be coarsely tuned by selecting one laser of a particular wavelength for the array, and then applying a heating current to fine-tune the wavelength. The lasers can be phase shifted DFBs for high single-mode yield. The heating can be performed monolithic to the device by passing current longitudinally through the p-type stripe, while the injection current passes vertically through the stripe. Alternatively an adjacent laser to the one selected can be activated, though not fiber coupled, such that the thermal load is sufficient to tune the selected laser. Thin film heaters placed on top or adjacent to the cavity can also be used. To minimize continuous power consumption, the on-chip heater can be used initially to tune the laser while the TE cooler responds on a slower time scale.

26 Claims, 10 Drawing Sheets

U.S. PATENT DOCUMENTS

| | | | |
|---|---|---|---|
| 5,420,416 A | 5/1995 | Iida et al. | |
| 5,468,975 A | 11/1995 | Valster | |
| 5,491,576 A | 2/1996 | Bergano | |
| 5,504,609 A | 4/1996 | Alexander et al. | |
| 5,612,968 A | 3/1997 | Zah | |
| 5,629,790 A | 5/1997 | Neukermans et al. | |
| 5,699,589 A | 12/1997 | Ripley et al. | |
| 5,715,047 A | 2/1998 | Adamovsky | |
| 5,771,253 A | 6/1998 | Chang-Hasnain et al. | |
| 5,777,763 A | 7/1998 | Tomlinson, III | |
| 5,784,183 A | 7/1998 | Aoki et al. | |
| 5,784,507 A | 7/1998 | Holm-Kennedy et al. | |
| 5,798,859 A | 8/1998 | Colbourne et al. | |
| 5,825,792 A | 10/1998 | Villeneuve et al. | |
| 5,870,417 A | 2/1999 | Verdiell et al. | |
| 5,882,468 A | 3/1999 | Crockett et al. | |
| 5,930,045 A | 7/1999 | Shirasaki | |
| 5,949,544 A | 9/1999 | Manning | |
| 5,953,359 A | 9/1999 | Yamaguchi et al. | |
| 5,959,750 A | 9/1999 | Eskildsen et al. | |
| 5,960,014 A * | 9/1999 | Li et al. | 372/20 |
| 5,977,567 A | 11/1999 | Verdiell | |
| 5,993,544 A | 11/1999 | Knauss et al. | |
| 5,999,303 A | 12/1999 | Drake | |
| 5,999,545 A | 12/1999 | Jeon et al. | |
| 6,044,705 A | 4/2000 | Neukermans et al. | |
| 6,049,554 A | 4/2000 | Lang et al. | |
| 6,078,394 A | 6/2000 | Wood | |
| 6,091,537 A | 7/2000 | Sun et al. | |
| 6,133,615 A | 10/2000 | Guckel et al. | |
| 6,175,668 B1 | 1/2001 | Borrelli et al. | |
| 6,183,092 B1 | 2/2001 | Troyer | |
| 6,201,629 B1 | 3/2001 | McClelland et al. | |
| 6,212,151 B1 | 4/2001 | Heanue et al. | |
| 6,227,724 B1 | 5/2001 | Verdiell | |
| 6,256,328 B1 | 7/2001 | Delfyett et al. | |
| 6,275,315 B1 | 8/2001 | Park et al. | |
| 6,275,317 B1 | 8/2001 | Doerr et al. | |
| 6,316,764 B2 | 11/2001 | Heffner et al. | |
| 6,327,063 B1 | 12/2001 | Rockwell | |
| 6,350,064 B2 | 2/2002 | Mitsuda et al. | |
| 6,352,376 B2 | 3/2002 | Walters et al. | |
| 6,483,969 B1 | 11/2002 | Yap et al. | |
| 6,516,017 B1 | 2/2003 | Matsumoto | |
| 6,522,793 B1 | 2/2003 | Szilagyi et al. | |
| 2001/0017876 A1 | 8/2001 | Kner et al. | |
| 2001/0036206 A1 | 11/2001 | Jerman et al. | |
| 2001/0050928 A1 | 12/2001 | Cayrefourcq et al. | |
| 2002/0064192 A1 | 5/2002 | Missey et al. | |
| 2002/0076480 A1 | 6/2002 | Hsieh et al. | |

OTHER PUBLICATIONS

International Search Report dated Jan. 21, 2003 for International Application No. PCT/US01/24969 and mailed Jan. 28, 2003 (3 pages).

"Broadband Lightwave Sources and System", Gayton Photonics Ltd., http://www.infowin.org/ACTS/RUS/PROJECTS/ac065.htm, printed Oct. 17, 2000 (4 pages).

Dellunde, Jaume, "Laser diodes", http://www.geocities.com/jdellund/receng.htm, printed Aug. 8, 2001 (4 pages).

Hunter, D.K., et al., "Guided wave optical switch architectures. Part 1. Space switching", International Journal of Optoelectronics, vol. 9, No. 6, 1994 (pp. 477–487).

Solgaard, O., et al., "Optoelectronic Packaging Using Silicon Surface–Micromachined Alignment Mirrors", IEEE Photonics Technology Letters, vol. 7, No. 1, 1995 (pp. 41–43) (4 pages total).

Li, G.P., et al., "16–Wavelength Gain–Coupled DFB Laser Array with Fine Tunability", IEEE Photonics Technology Letters, vol. 8, No. 1, Jan. 1996 (pp. 22–24).

Gordon, C., "Hybrid Mode–Locked DBR–laser", Multidisciplinary Optical Switching Technology Center, http://www.ece.ucsb.edu/MOST/33.html, (last updated Jan. 22, 1996), printed Aug. 5, 2001 (3 pages).

Daneman, M. J., et al., "Laser–to–Fiber Coupling Module Using a Micromachined Alignment Mirror", IEEE Photonics Technology Letters, vol. 8, No. 3, Mar. 1996 (pp. 396–398).

Wu, M., "Micromachining for Optical and Optoelectronic Systems", Proceedings of the IEEE, vol. 85, No. 11, Nov. 1997 (pp. 1833, 1943–1952).

Jacques, S., "Phase conjugate mirror and diffraction grating yield stable, collimated, coherent, high–power diode laser.", Oregon Medical Laser Center Newsletter, http:///omlc.ogi.edu/news/dec97/pclaser.html, printed Apr. 9, 2001, (2 pages).

Shirasaki, M., "Chromatic–Dispersion Compensator Using Virtually Imaged Phased Array", IEEE Photonics Technology Letters, vol. 9, No. 12, Dec. 1997 (pp. 1598–1600).

Kudo, K., et al, "Multiwavelength microarray semiconductor lasers", Electronics Letters, vol. 34, No. 21, Oct. 15, 1998, (pp. 2037–2039).

Kopka, P., et al., "Bistable 2×2 and Multistable 1×4 Micromechanical Fibre–optic Switches on Silicon", Micro Opto Electro Mechanical Systems, MOEMS 1999 (4 pages).

"(BW)(OH–MARCONI–COMM–2) Marconi Communication Announces World–Beating Commercial Tuneable Laser at Telecom '99", Press Release, http://www.businesswire.com/cgi–bin/ts_headline.sh?/bw.101199/192842212, Oct. 11, 1999, printed Oct. 17, 2000 (2 pages).

Maluf, N., "Optical Switches", An Introduction to Microelectromechanical Systems Engineering, 2000, pp. 187–190 (3 pages).

Nakano, H., "Technological Trends of Optical Communication Devices for DWDM", NEC Device Technology International 2000, No. 59 (5 pages).

Liu, F., et al., "Cost–effective wavelength selectable light source using DFB fibre laser array", Electronics Letters, vol. 36, No. 7, Mar. 30, 2000, pp. 620–621, (3 pages).

Hunwicks, A., "Advancing the Optical Component", http://www.telecoms–mag.com/issues/200004/tci/advancing.html, Apr. 2000, printed Oct. 17, 2000 (6 pages).

Pezeshki, B., et al., "12nm tunable WDM source using an integrated laser array", Electronics Letters, vol. 36, No. 9, Apr. 27, 2000 (pp. 788–789).

Howe, P., "Light fantastic", digitalMASS at Boston.com, http://digitalmass.boston.com/news/daily/05/22/light_fantastic.html, printed Oct. 17, 2000 (5 pages).

Silverman, S., "Vcs beam big bucks at optics upstarts", Redherring.com Oct. 9, 2000, http://www.redherring.com/vc/2000/1009/vc–optics100900.html?id=yahoo, printed Oct. 10, 2000 (5 pages).

* cited by examiner

LASER THERMAL TUNING

CROSS-REFERENCE TO RELATED APPLICATIONS

This application claims the benefit of U.S. provisional application No. 60/244,644 filed Oct. 30, 2000, and No. 60/307,484 filed Jul. 24, 2001, which are hereby incorporated by reference as if set forth in full herein.

BACKGROUND

The present invention relates to laser wavelength tuning, and more particularly to thermally tuning laser wavelength output.

Tunable lasers are highly desirable for multi-wavelength telecommunication links. Though there are a variety of laser structures that can tune the output wavelength, such structures generally suffer from various disadvantages such as low output power, small tuning range, poor spectral quality, or short lifetime. Compared to standard fixed wavelength distributed feedback (DFB) lasers, tunable lasers almost always compromise some functionality to obtain wavelength tunability.

An alternative technique to using a single tunable laser is to select a particular laser from a multi-wavelength array. A structure for performing such a technique may include an array of multiple wavelength lasers fabricated on one chip. Some means, for example a movable mirror, couples a particular laser of the array, to an output fiber. Only one laser is operated at a time, with the choice of lasers governed by the desired wavelength.

To keep the number of lasers manageable, the wavelength spacing between the lasers is made fairly large, and the temperature of the chip is adjusted by changing the temperature. Since high performance semiconductor lasers are usually stabilized with a thermo-electric (TE) cooler, the temperature can be easily adjusted electronically using a TE cooler. The tuning rate of DFB lasers in the 1.55 um communication band is about 0.1 nm/C. Thus changing the temperature from about 10° C. to 40° C. can allow 3 nm tuning without deleterious effects on the device performance or lifetime.

Unfortunately, when a TE cooler is used to fine tune the wavelength, the tuning time is relatively long, on the order of a second. For many applications, such as wavelength provisioning in the SONET telecommunication format, much faster tuning times on the order of milliseconds is preferred.

BRIEF SUMMARY OF THE INVENTION

The present invention describes a number of techniques of applying localized heating in a multi-wavelength semiconductor laser array for rapidly fine tuning the output wavelength. Current can be driven along a laser stripe, and thus obviating the need for a separate heater. One additional contact is used per laser for thermal tuning. Alternatively, lateral metallization can be applied adjacent to the lasing stripes, with all the lateral metallization electrically connected to one contact. Applying current through this contact to the active stripe causes the active element to heat. In this technique, one extra electric contact is used for the entire array. Another method is to apply a reverse bias to at least one adjacent laser of the array to cause current to flow in the top doped cladding, which has a negligible effect on the optical power output, but heats the laser element. In a closely spaced array, thermal cross talk between the lasers can also be used to tune the wavelength. In such a design, only the selected laser is optically coupled to the output, thus activating adjacent lasers does not affect the optical output directly. However the heat generated by the adjacent laser will thermally tune the optically coupled device. If optical cross-talk is an issue, the adjacent laser can also provide heat without light if the adjacent laser is reverse biased, particularly strongly reversed biased. Individual thin film heaters can also be used in the array. In a set of operating conditions, the individual film heaters, or other heaters discussed herein, rapidly tune the wavelength of the laser while the TE cooler has time to respond. Thus, the heater would only be used for a short time during the tuning cycle, and little extra power would be required otherwise.

In one embodiment, the present invention comprises a thermally tuned optical device. The optical device comprises a diode laser having a substrate, a waveguide, and an active region between the substrate and the waveguide. The optical device further includes an electrical contact on the substrate, the substrate being at a substrate potential, a metal layer in thermal contact with the waveguide, and a first electrical contact and a second electrical contact. The first electrical contact is on the metal layer whereby application of a first potential to the first electrical contact causes the diode layer to lase. The second electrical contact is on the metal layer, whereby application of a second potential to the second electrical contact causes a current to flow between the first electrical contact and the second electrical contact, thereby heating the laser.

In a further embodiment, the present invention comprises a thermally tuned laser array. The array comprises an array of ridge waveguide diode lasers. The ridges are separated by an interstripe area. A metal contact is on top of each ridge, each metal contact therefore corresponding to a laser in the array of lasers. An interstripe metallization is in each interstripe area. One of the metal contacts is set to a potential at least sufficient to cause the corresponding laser to emit light. At least one interstripe metallization in an interstripe area about the one of the metal contacts set to the potential is below that otherwise caused by setting the metal contact to the potential.

In a further embodiment, the present invention comprises a method of thermally tuning a diode laser. In one embodiment the method comprises selecting a laser of the array of lasers. The method further comprises applying a thermal signal to a contact on the array of lasers, and applying a signal to a thermal electric cooler.

These and other aspects of the present invention are more readily understood upon viewing the figures indicated below in conjunction with the following detailed description.

DETAILED DESCRIPTION

Figure 1:
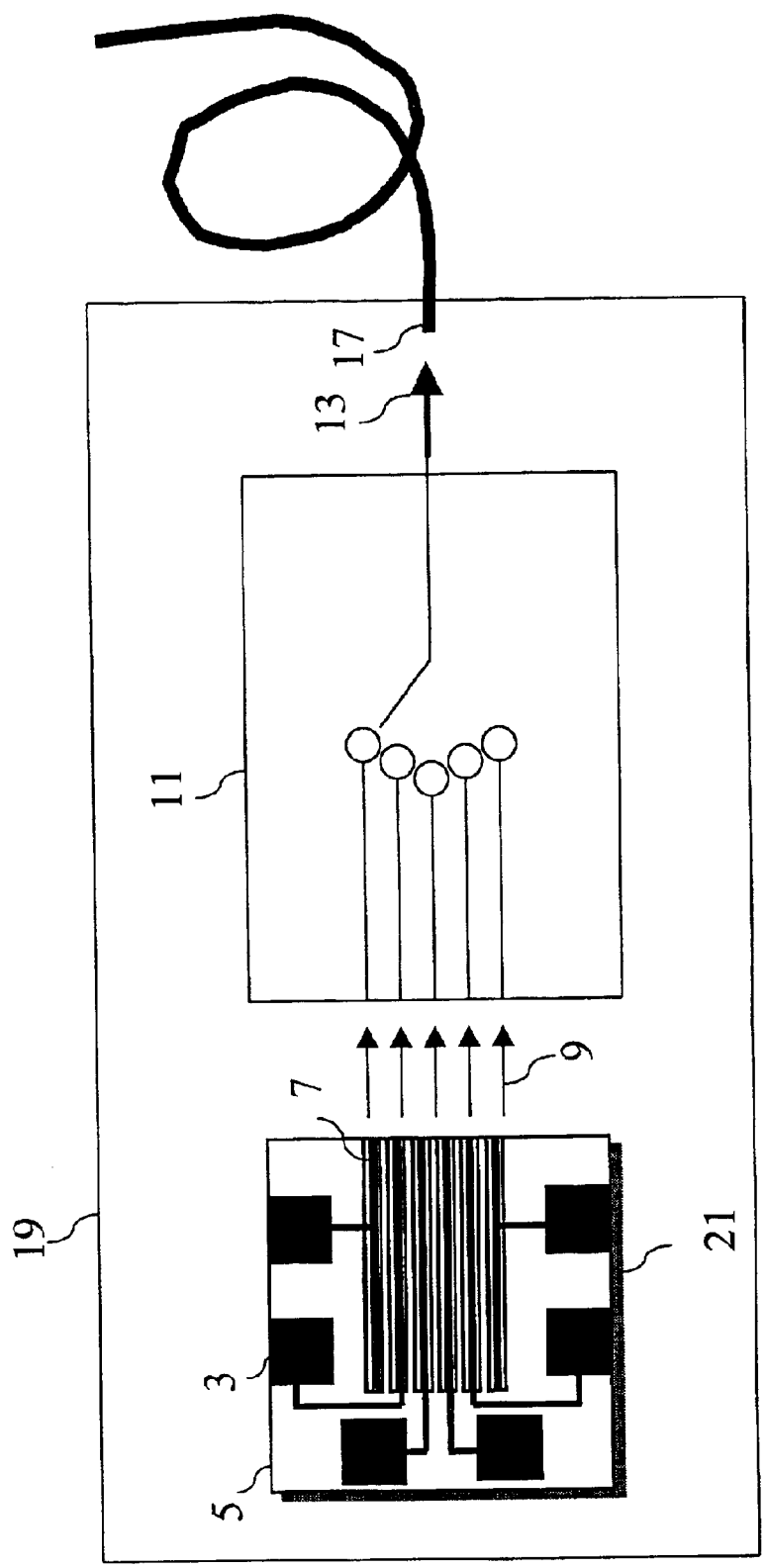
FIG. 1 illustrates one embodiment of an optical transmission apparatus having an individually addressable multi-wavelength laser array directly coupled to a 1:N micromechanical switch.

FIG. 1 shows an array of single frequency lasers, such as distributed feedback (DFB) devices, on a semiconductor substrate. The array of lasers comprises a number of independently addressable lasers or laser elements 7 on a substrate 5. In one embodiment, a thermo-electric (TE) cooler 21 is coupled to the substrate to thermally tune a laser. Each laser has a separate contact pad 3 from which current is injected into the laser. Each laser is designed to operate at a different lasing wavelength.

When current is injected into the laser using, for example, contact pads 3, the laser emits radiation with a specific wavelength and from a particular position on the substrate, as represented by the arrows 9. In one embodiment, one laser is operated at a time, depending on the desired wavelength. The radiation or light from the lasers is transmitted to a micro-mechanical optical switch or switching element 11. The switching element has a number of states. In each particular state of a set of states, one of the input optical beams, i.e., light from one of the lasers, is transferred to the output 13 and transferred to the output fiber 15. The entire assembly is packaged together on one submount 19. In one embodiment, the TE cooler is coupled to the submount to thermally tune the selected laser.

To assign different wavelengths to each laser, a number of techniques can be used, such as directly-written gratings with electron beam lithography, stepping a window mask during multiple holographic exposures, UV exposure through an appropriately fabricated phase mask, or changing the effective index of the mode of the lasers. Generally, for stable single mode characteristics, either a controlled phase shift is also included in the laser or gain/loss coupling is used in the grating. The wavelength of such lasers can be accurately controlled through dimensional variables, such as stripe width or layer thickness, and varied across the array.

In some embodiments, individual laser elements are individually heated for fine tuning. The wavelength of the array is individually coarsely tuned by selecting one laser of a particular wavelength from the array. The wavelength of the selected laser is fine tuned by applying a heating current to the device, resulting in heating of the laser. In one embodiment, the heating is performed monolithic to the device by passing current longitudinally through the p-type stripe of the laser, while an injection current passes vertically through the stripe. In another embodiment, a laser adjacent to the laser selected is activated, though not fiber coupled, such that the thermal load generated by the adjacent laser tunes the selected laser. In a further embodiment, thin film heaters are placed on top or adjacent to the laser cavity. For the embodiments of on-chip heating and heaters described herein, on-chip heating may be performed initially to tune the laser while a TE cooler responds on a slower time scale, thereby minimizing continuous power consumption.

Figure 2:
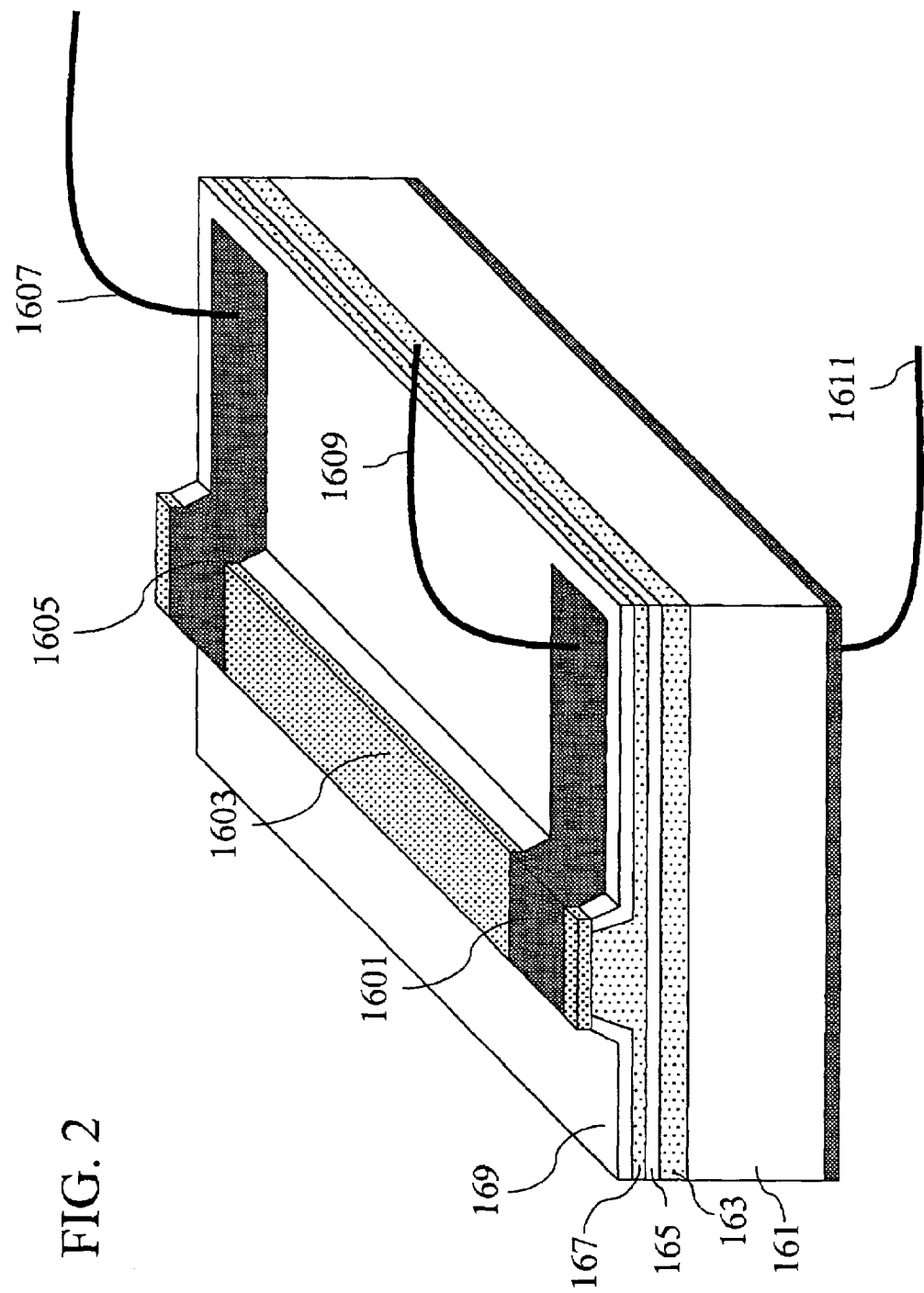
FIG. 2 illustrates one embodiment of a semiconductor waveguide laser.

Turning to some specific examples in accordance with the above-described aspects, and additional aspects, of the present invention, FIG. 2 illustrates a semiconductor waveguide laser. The laser is a simple ridge waveguide laser, though in other embodiments buried hetero-structure, buried rib, or other types of lasers are used. In the laser of FIG. 2, the laser epitaxial layers are grown on an n-type InP substrate 161. The first layer of the laser is an n-type epitaxially grown InP lower cladding layer 163, then a undoped InGaAsP quaternary active layer 165, and then a top p-type InP cladding layer 167. The top p-type InP cladding layer is etched in the shape of a ridge using conventional photolithography. For a DFB laser, the growth is interrupted midway and a grating is etched into the laser (not shown). After the ridge is etched, the wafer is coated with an insulating dielectric 169, such as silicon nitride, with the dielectric is removed on top of the ridge to form layer 169.

Metallization is applied to the top of the ridge, as shown by element 1603. A second metallization step provides contact regions 1601 and 1605 at the ends of the stripe. The contact regions are electrically accessed by wires 1609 and 1607. The backside of the substrate is also metallized and electrically contacted with a wire 1611.

In operation, current flowing vertically through the laser, from the cladding layer 167 to the substrate contact 1611, causes the laser to lase. Placing the contact pads 1601 and 1605 at different potentials causes current to flow horizontally through the metallization layer 1603. The resistance of the metallization layer is determined by the thickness of the layer.

The electrical resistance of the laser diode is generally governed by the vertical conduction through the p-type top cladding 167, and a beneficial design minimizes this resistance without increasing the doping to such an extent as to increase the optical absorption of the lasing mode. Generally this vertical resistance is a few ohms in standard lasers. Since relatively uniform injection of carriers into the laser is desirable, the electrical resistance of the top metallization element 1603 as measured between wires 1609 and 1607 is preferably smaller than the vertical resistance of the laser. Since the electrical resistance of the top metallization element can be adjusted by varying the thickness of metallization 1603, the electrical resistance can be made small enough to provide uniform injection into the diode, but large enough such that a reasonable electrical current passed between wires 1609 and 1607 resistively heats the lasing stripe.

Figure 3:
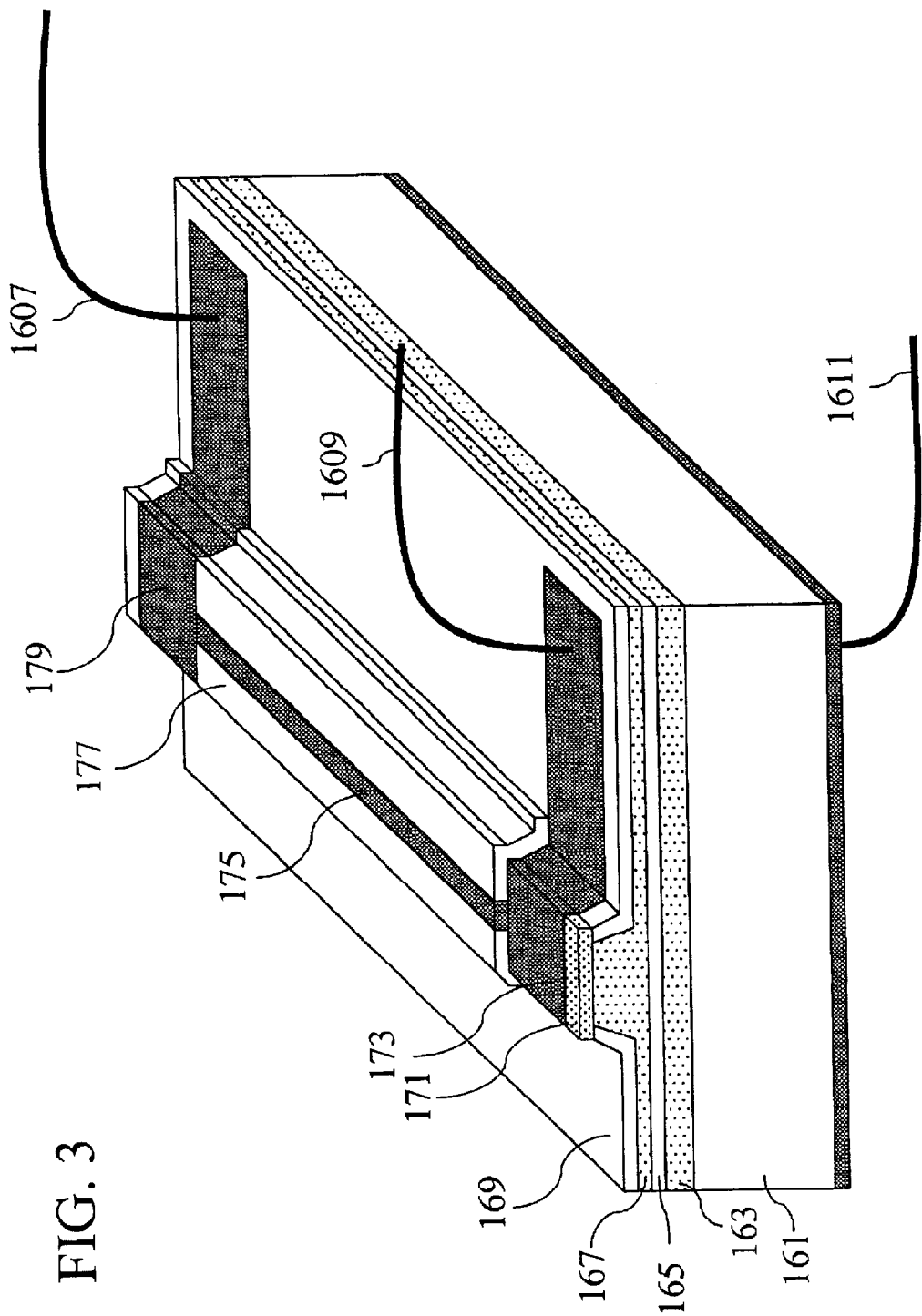
FIG. 3 illustrates another embodiment of a semiconductor waveguide laser.

FIG. 3 illustrates a further embodiment in which a vertically driven laser is heated using a horizontal current. As in FIG. 2, FIG. 3 illustrates a laser with an n-type InP substrate 161, an n-type InP lower cladding layer 163 on top of the substrate 161, an undoped InGaAsP active layer 165 on top of the n-type cladding layer 163, and a ridged p-type InP cladding layer 167. The ridged p-type cladding layer is on top of the active layer 165, and for a DFB laser includes a grating midway through the layer. An insulating dielectric 169 overlays the p-type cladding layer, except for the top of the ridge. A top metallization layer 171 runs the length of the ridge. The top metallization layer, in the embodiment of FIG. 3, can be made very thick, since this element is no longer used as the heating resistor.

After depositing or plating the metallization layer, the device is coated with a further dielectric layer and lithographically patterned to form a further dielectric layer 177. The further dielectric layer covers nearly all the stripe except the very front. Contact pads 173 and 179 are then formed in a subsequent step along with a thin connecting layer 175. The contact pad 173 is placed on the front of the stripe, or ridge, and contacts the metallization layer. The contact pad 179 is on top of the further dielectric layer, and at the rear of the stripe in the embodiment of FIG. 3. The thin connecting layer connects the contact pads.

A heating current is applied to the connecting layer using wires 1607, 1609, each of which are connected to one of the contact pads. By including the further dielectric layer 177, the heating current applied between wires 1609 and 1607 is fully decoupled from the injection current of the laser, applied between wires 1609 and 1611. Thus, the further dielectric layer of insulation and a subsequent metallization step decouples the uniform charge injection from the heater resistance and allows for higher resistance, and heating, by the horizontal heater.

FIGS. 2 and 3 show a single element device. In further embodiments, a multi-wavelength array is formed aggregating a number of adjacent single element devices. Multi-wavelength operation is provided, for example, as discussed with respect to FIG. 1. Depending on the contacting arrangement, an additional layer of insulation may be useful so that the metallization element does not short the devices together. The embodiment described in FIG. 3 is particularly well suited for arrays, as the contact 179 of each element of the array can be connected together. Since the electrical resistance between the contact 179 and 173 is quite high, there is adequate isolation between the lasing elements with a much simplified contacting procedure. Current is injected between the selected laser p-contact wire 1609 and the general n-contact 1611 wire to turn the laser on, and then heating current is applied between all the heater wires 1607 shorted together and the selected p-contact 1609 wire. Such an array only has one additional contact for the heater element.

For a laser array application with N lasing stripes, devices using heating elements in accordance with the embodiments of FIG. 2 results in 2N top contacts, and a common backside contact. As mentioned, for the extra metalization case of FIG. 3, all of the heater contacts 179 are tied together in a single metalization element in one embodiment. This reduces the number of electrical connections to be made to the chip to N laser contacts, the substrate, and the heater contact. As long as the unused laser contacts are allowed to float and the heater voltage does not forward bias the lasers (which puts a lower bound on heater resistance), then only the operating laser is heated.

Figure 4A:
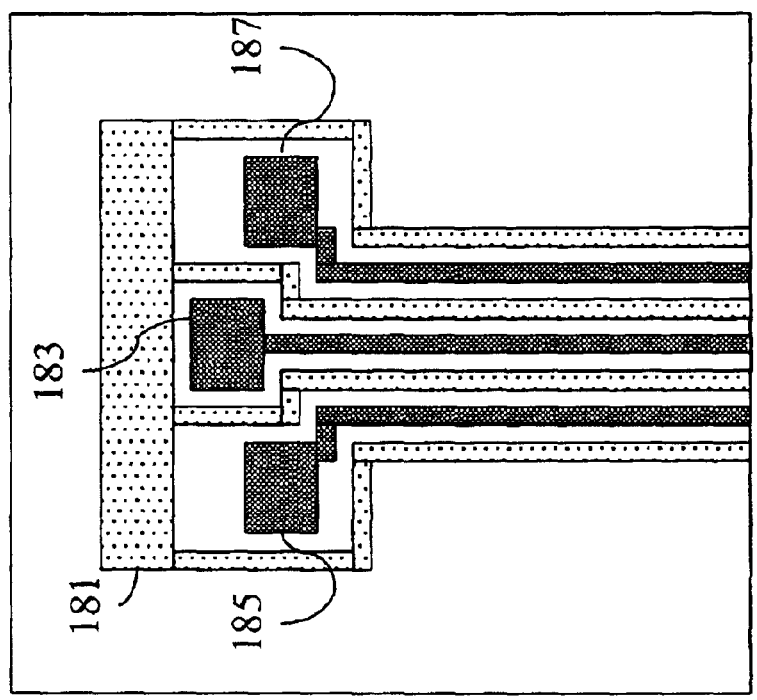
FIG. 4A illustrates a top view of another embodiment of a semiconductor waveguide laser.
Figure 4B:
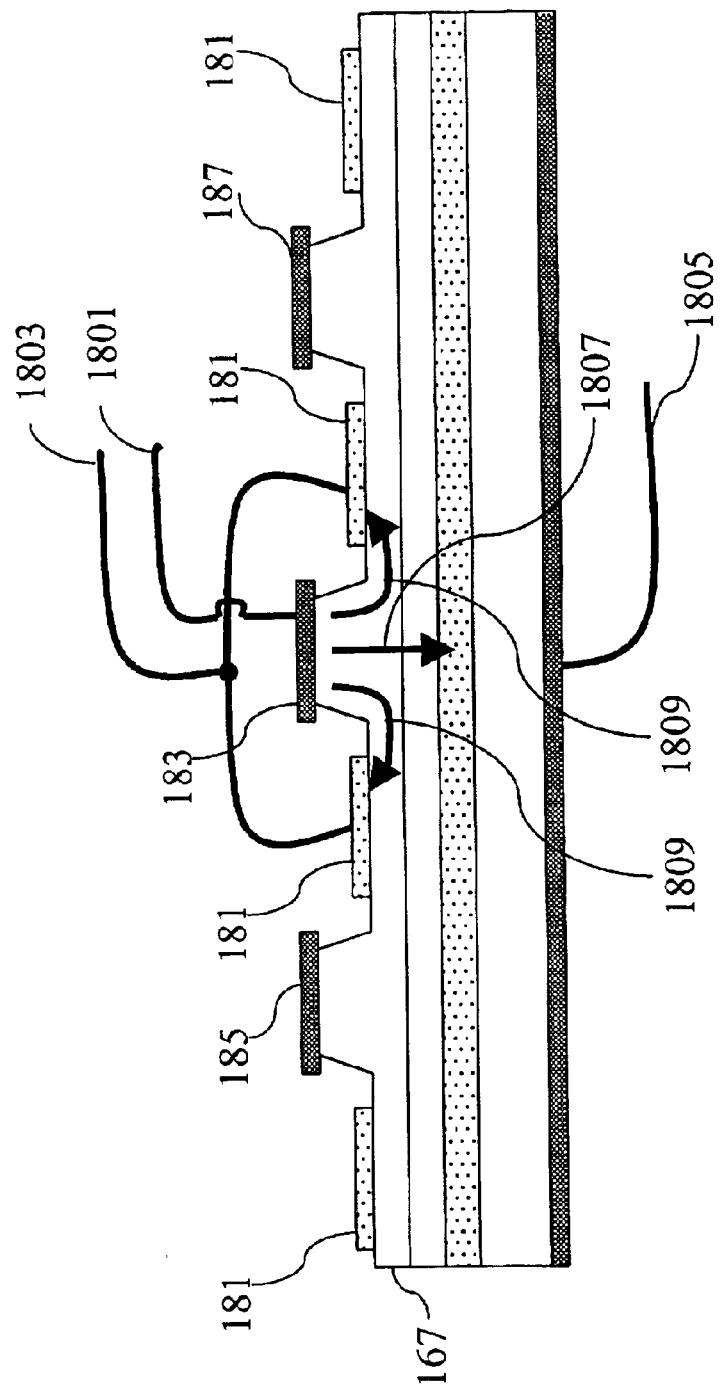
FIG. 4B illustrates a cross section view of the semiconductor waveguide laser of FIG. 4A.
Figure 4C:
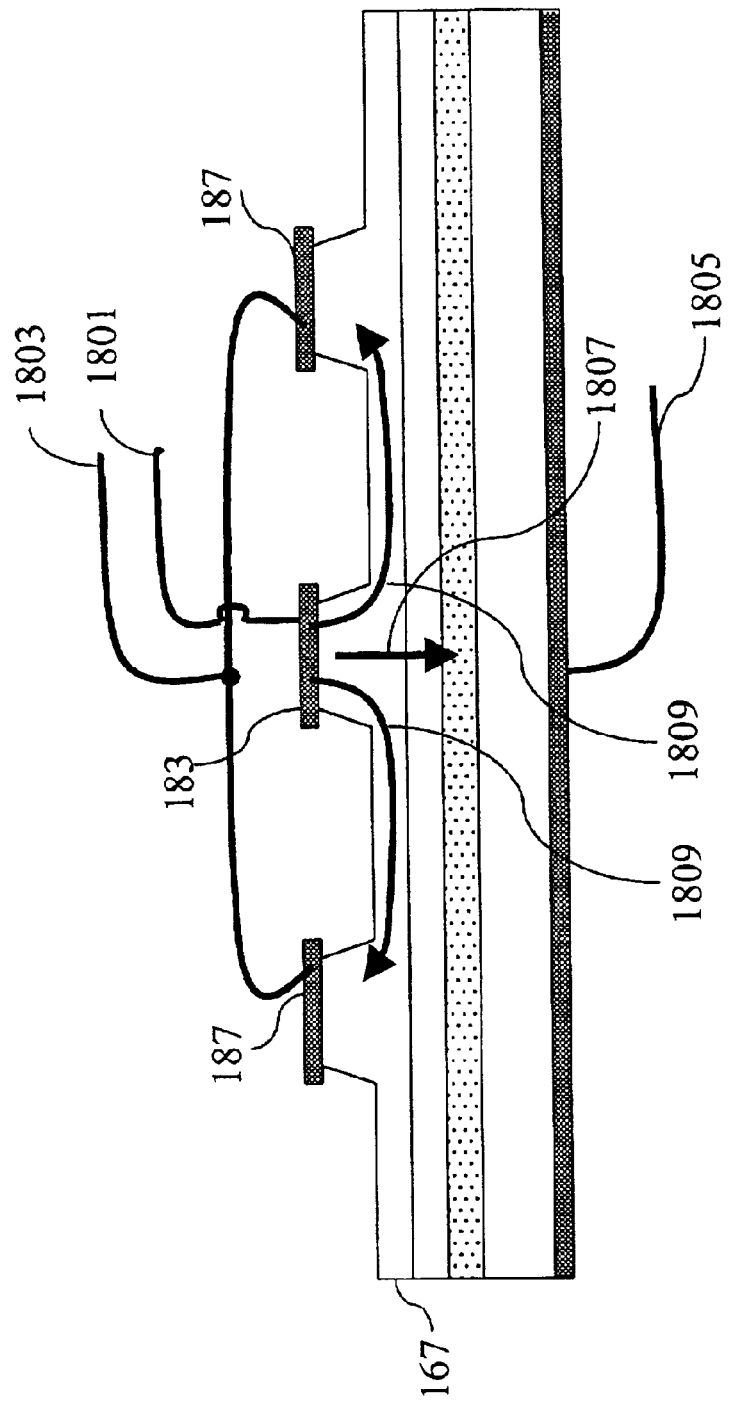
FIG. 4C illustrates a cross section view of another embodiment of semiconductor waveguide lasers.

An alternative embodiment for reducing the number of top contacts for array applications is shown in FIGS. 4A 4B, and 4C. FIG. 4A shows the top view of such a chip with an array of three lasers. FIG. 4B illustrates a cross-section of the chip of FIG. 4A. In the embodiment of FIGS. 4A and 4B, the semiconductor chip is processed as before, with independent contacts 183, 185, 187 on top of each ridge. In addition to these contacts, contacts 181 are provided in the space between the different laser ridges, and the contacts 181 are shorted together and electrically contacted with a wire bond. Thus, for an array of N lasers, there are N+2 contacts to the entire chip, with N contacts for each laser stripe, one contact to the space between the lasers, and one contact to the substrate.

Since the lasers are DFBs and the feedback arises from the grating embedded in the waveguide, the laser stripes do not have to extend the entire length of the chip. The space behind the lasers, therefore, can be used for metallization and contact pads. Alternatively, the lasers extend along the chip and multi-layer metal are used to connect the wiring.

The cross-section of FIG. 4B also illustrates further aspects of the present invention. As in FIG. 4A, metallization elements 185, 183, and 187 are connected to the tops of the laser ridges, while an electrically connected metallization element 181 runs between the ridges. A wire 1801 is coupled to the center metallization element on the center ridge, and a wire 1803 is coupled to the inter-striped metallization. A wire 1805 is coupled to the bottom substrate. For normal injection into the central diode, a current is applied between wires 1801 and 1805, thereby forward biasing the p-n junction and activating the laser, while the inter-stripe metallization 181 is allowed to float. For example, in one embodiment, the substrate contact 1805 is grounded, and the wire 1801 forward biased to about 2 volts. Under these conditions, a voltage exists at the interstripe metallization contacted by wire 1803, caused by p-type carriers drifting to the contact and slightly forward biasing the junction between the stripes. However, if the voltage at the interstripe metallization is allowed to float, the leakage current should be no greater than the case with no metallization.

To raise the temperature of the selected device, the voltage on the interstripe metallization is reduced, perhaps even below the ground level, causing an electric field to appear from the active stripe 183 to the adjacent interstripe metallization. This field causes carriers 1809 to drift to the interstripe contact. If current through the laser stripe and exiting from the substrate wire 1805 is maintained, the additional current injected through the top wire 1801 will simply pass to the adjacent interstripe metallization and cause heating. As a result the stripes 185 and 187 that are not activated are minimally affected. The metallization between them will be reverse biased, but if stripes 185 and 187 are floating, no current and excess heat are produced.

Generally, in laser design, a thin layer of small bandgap material, such as InGaAs, is grown on top of the InP cladding layer to allow for good ohmic contact to the top metallization. In FIGS. 4A and 4B, this thin layer is not present in all embodiments for the interstripe metallization 181 as the layer had been etched to form the ridge. This is actually beneficial for the heating process, as it results in a larger voltage drop between metallization 181 and the p-type InP layer 167. Furthermore, the doping levels are also reduced near the active region in optimized structures, which further increases the resistance, and thereby the voltage and the heating.

In another embodiment, shown in FIG. 4C, no interstripe metallization is used. The adjacent lasers are reverse biased to realize much the same effect. The doping and the thickness of the p-type top region between the stripes should be sufficiently high such that reverse biasing the adjacent laser diodes does not fully deplete this layer between the stripes. If the layer is fully depleted, the power output of the main laser may be reduced.

In an alternate embodiment, the interstripe metallization is used in forward biasing. In such an embodiment, current is injected directly into the p-n junction and causes heat. Poor ohmic contact of the metallization, for example through decreased doping or avoiding the use of an InGaAs on top of the InP cladding layer, is an advantage, as it increases the voltage and therefore the heating. If the injected carriers disturb the optical mode, isolation trenches can be etched, about the waveguide. In another embodiment, doped junctions are placed below the interlayer metallization. This aids both in applying a reverse bias to the contacts, and actually increases the resistance of the diode by spreading the depletion region to under the main ridge.

Figure 5:
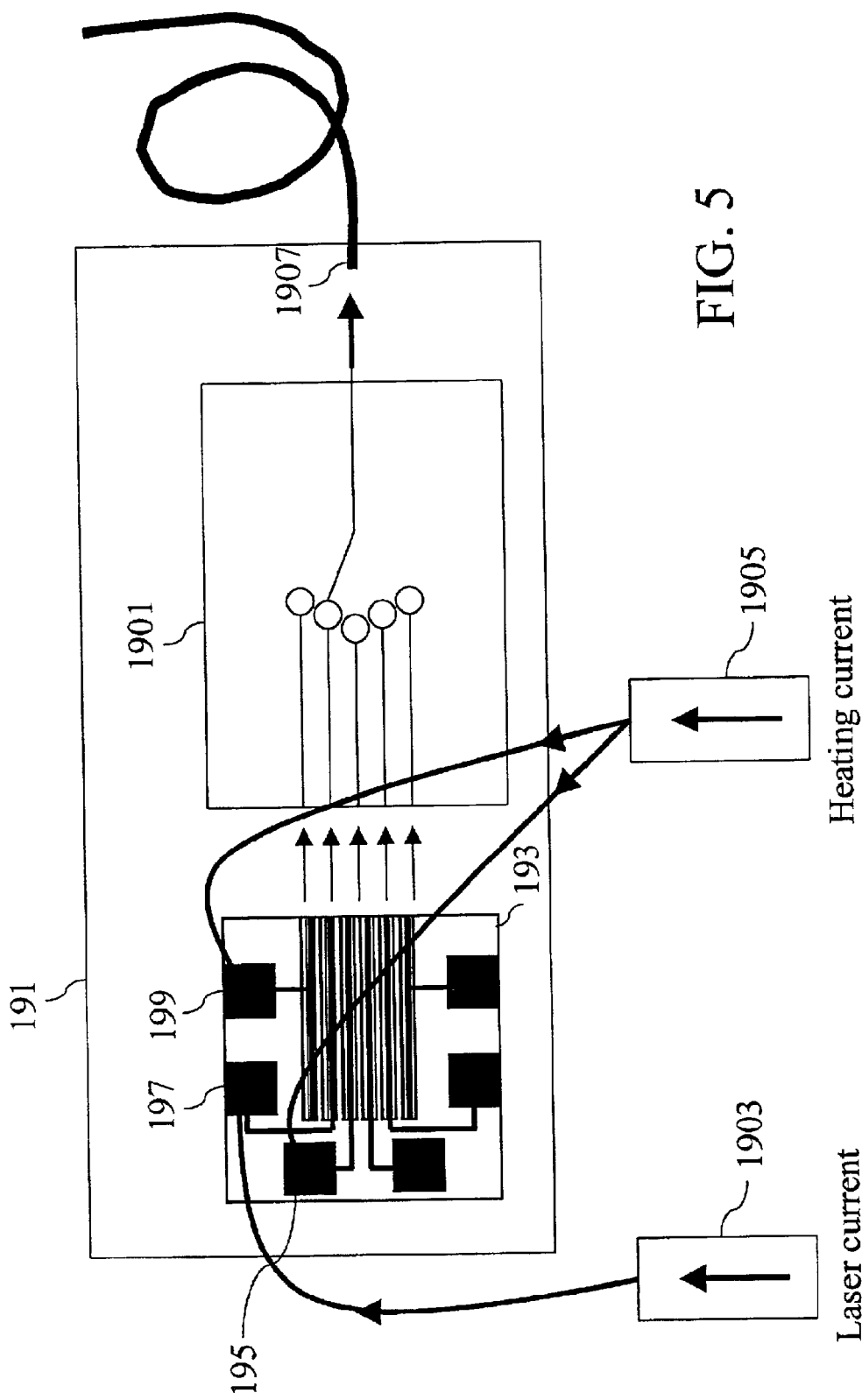
FIG. 5 illustrates one embodiment of a thermal cross-talk reduction system for various embodiments of an optical transmission apparatus.

For closely spaced arrays, there is considerable thermal cross-talk between the stripes, and rapid thermal tuning is accomplished by injecting current into nearby stripes. Presumably only the desired laser is coupled to the output fiber, thus the effect of injecting current into the adjacent stripes will only be the thermal cross-talk. One embodiment of such a system is shown in FIG. 5. A package 191 contains a multi-wavelength independently addressable laser array 193 and a 1:N microswitch 195. The microswitch selects an optical beam from a particular laser and couples the selected optical beam into an output fiber 1901. In FIG. 5, the switch is shown selecting the second laser from the top and sending the light from this laser to the output fiber. Light from the other lasers is lost in the package. The contact pad 197 is associated with this selected laser. Adjacent laser contact pads 199 and 1907 are respectively associated with the adjacent lasers. Two current sources are also associated with the package. The current drive 1903 for the selected laser is connected to contact pad 197 while the thermal tuning current 1905 is connected to the adjacent laser contact pads 199 and 1907. When the switch 195 selects another laser, the current supplies are reconfigured.

Depending on the details of the implementation, optical cross-talk may be an issue inside the package. If the performance of the switch is inadequate, some of the light from the adjacent lasers will pass through the switch and make it to the fiber output, affecting the purity of the light delivered to the system. In this case the heat in the adjacent lasers can be produced without causing light emission by reverse biasing the adjacent lasers. Some photons from the active laser will leak into the reverse bias junction, which along with regular leakage current will generate heat as they are swept out under the reverse bias voltage. Such an embodiment may be achieved, for example, using the embodiment of FIG. 5 with the modification of the current source 48 to a reverse biased voltage or current source.

Figure 6:
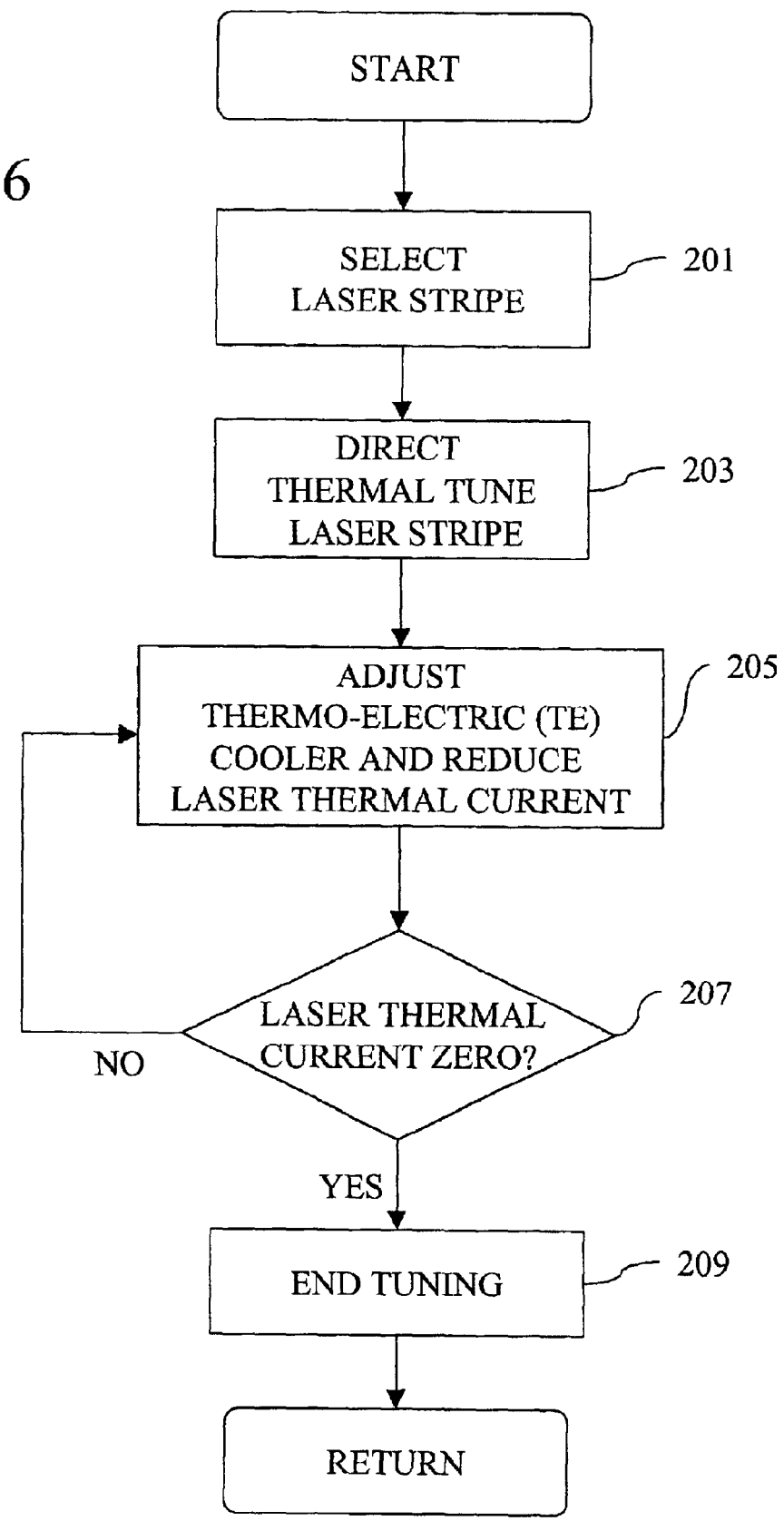
FIG. 6 illustrates a flow diagram of one embodiment of a process of thermally tuning a laser.

In cases where power consumption is an issue, integrated heaters as described here would be used to rapidly tune the wavelength of the laser while the TE cooler has time to respond. For instance, FIG. 6 illustrates a flow diagram of such a process of thermally tuning a laser. In block 201, the process selects a laser having a desired wavelength. In one embodiment, a laser having a particular wavelength is identified by consulting a look-up table and is selected out of an array of laser by injecting current via a contact into the identified laser. As a result, the laser emits light. In block 203, the process directly thermally tunes a selected laser stripe. The laser is directly thermally tuned, as previously described in one embodiment, by injecting current substantially perpendicular to the current injected into the laser which caused the laser to lase.

In block 205, the process activates a thermoelectric (TE) cooler and adjusts the TE cooler to thermally tune the selected laser. As the TE changes the temperature of the optical sub assembly and warms up the laser chip, the direct heating current is reduced accordingly, such that the temperature of the active waveguide and thus the wavelength stays the same. Feedback from a wavelength locker can be used to make sure that the reduction in the direct heating current exactly balances the increased heat generated by the TE. In block 207, as the TE cooler may take some time to respond, the process determines if the TE cooler is operating such that the TE cooler is thermally tuning the selected laser, and whether the direct heating current is zero. If, in block 207, the process determines that there is still some directly injected heating current, the process waits and then repeats, continuing back to block 25, to increase the TE cooler current and reduce the direct heating current further. Otherwise, the process continues to block 27 and terminates the thermal tuning. The process then returns. The process, in one embodiment, is continuous. As the TE cooler causes the temperature to rise, the direct heating current is reduced accordingly such that the laser stripe temperature, and the wavelength stays the same. The use of a wavelength locker, in one embodiment, helps the process, as tracking the wavelength yields accurate information about the lasing stripe temperature.

Thus, the heater would only be used for a short time during the tuning cycle, and little extra power would be required. The advantage of this approach is that the TE cooler is generally a more efficient means of heating a device. In many applications, such as a backup laser for a WDM transmitter, this can be important, since the laser can initially be put in a "Stand-by" condition at a low TE adjusted temperature, and can thereby move to any wavelength very rapidly.

If thermal tuning is used only for short time periods, no additional heater may be needed as increasing the laser current thermally tunes the laser. Constant optical power at the output can also be maintained by decreasing the optical coupling during these high current periods. In many applications, single frequency lasers can actually be run at much higher currents than their nominal specifications without degradation in the optical quality. However, lasers are often de-rated to maintain adequate life. For these tuning applications, where they are required to run at higher currents for a very short period of time, the effects on the lifetime of the lasers are negligible.

Figure 7:
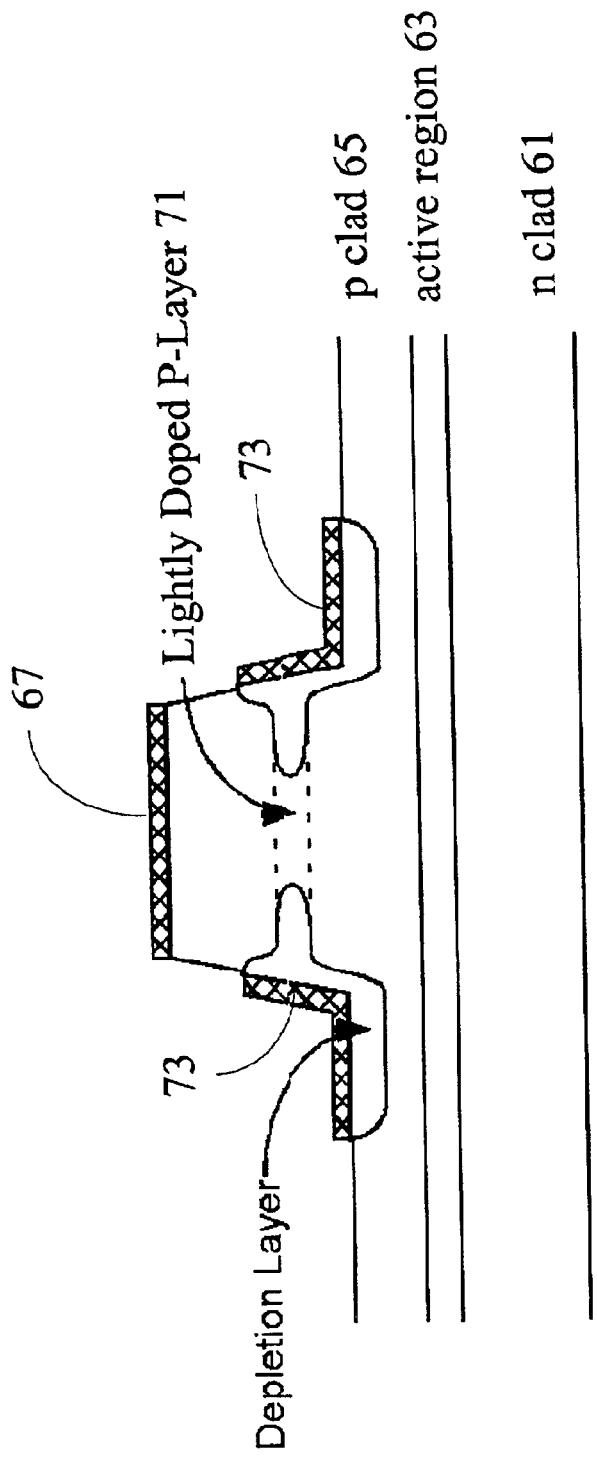
FIG. 7 illustrates an embodiment of controlling thermal dissipation using Schottky contact.

In one embodiment a third contact is placed on the laser diode which controls the amount of power dissipated in the device. FIG. 7 illustrates one embodiment of adjusting power dissipation in a laser using Schottky contacts. As illustrated in cross-section, an n-type InP cladding layer 61 is grown on an n-type InP substrate (not shown). An undoped InGaAsP active layer 63 is on top of the n-type cladding layer. A ridged p-type InP cladding layer 65 is on top of the active layer, and the p-type cladding layer includes a grating. A metal contact layer 67 is on top of the ridge, and in combination with a contact layer under the substrate bias the diode so as to inject current into the laser.

Metal contacts 73 are placed on the p-cladding, proximate to the ridge. The metal contacts may be viewed as middle electrodes as the metal contacts are, as illustrated, vertically between the bottom substrate contact, or electrode, and the top ridge contact, or electrode. The metal contacts placed on the p-cladding form Schottky contacts.

The Schottky contacts are reverse biased in order to deplete a lightly doped layer 71. As illustrated in FIG. 7, the lightly doped layer extends substantial across a portion of the ridge formed by the p-type cladding layer. The middle electrodes 73 are placed so as to be partially on the side of the ridge of the p-cladding. Reverse biasing the middle electrodes depletes the lightly doped layer. Depending on the amount of reverse bias voltage applied, the resistance of the doped layer can be changed. Thus, by changing the resistance, the bias current crossing the laser generates heat. In one embodiment, in order to completely deplete the layer with a couple of volts of reverse bias a doping level of approximately $10^{15}/cm^3$ is used, for a 4 um stripe width laser. This is fairly low, and in practice such a layer may be intrinsically doped with the surrounding p-layers providing the doping. In p-type cladding layers, a positive voltage is applied to a schottky contact to reverse bias the junction and deplete the carriers under the stripe.

Alternatively, the junction can be forward biased (by applying a negative voltage compared to the voltage at 67)

and some of the hole current can be extracted. The current at 67 would be increased accordingly, and the extra current flowing between 67 and 73 would be only a heating current that would raise the temperature.

Figure 8:
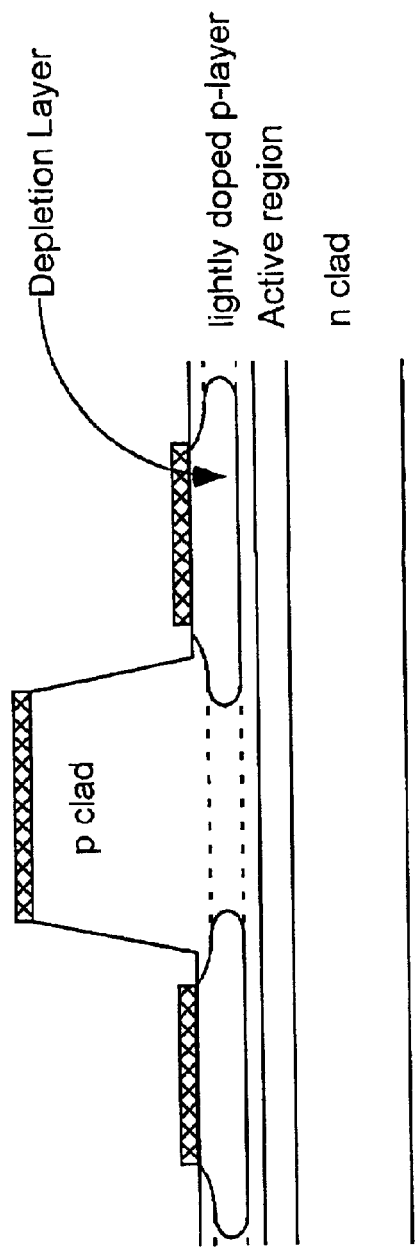
FIG. 8 illustrates one embodiment of controlling thermal dissipation using an alternate depletion layer.

FIG. 8 illustrates one embodiment of controlling thermal dissipation using alternate depletion layer which does not use metallization on the sidewalls. In this embodiment, the depletion layer is buried close to the active region and flat contacts are used. A thin layer of doped material is depleted before depleting the lightly doped layer. The depletion spreads sideways following the lightly doped layer to begin to pinch off the laser. This embodiment has the advantage of relaxed metal patterning requirements and the low-doped layer next to the active region will help with free carrier absorption.

However, the mode size of the laser may change as the device is pinched off. Also, having a lightly doped layer so close to the active region may contribute to carrier leakage. This problem can somewhat be alleviated by have a p-doped spike close to the active region to block electrons from escaping over the barrier. Forward biasing these junctions also provide heat in the same way as described in FIG. 4B The foregoing embodiments may be used, for example in an array of DFBs on a single substrate. An array of DFBs is useful in that different DFBs in the array may be used as backups in the event of failure or excessive degradation of a particular DFB. In addition, the DFBs may generate light at different wavelengths, with the array thereby providing wavelength selection, or tunability, of the output of a laser package.

In one embodiment the depletion layers are used to pinch off adjacent DFBs in the array of DFBs. The adjacent DFBs are pinched off to prevent lasing of the DFBs, and possible interference with the use of the output of a particular selected DFB. The adjacent DFBs, however, generate heat, which affects the temperature of the selected DFB, assuming the stripes forming the DFBs are in sufficient proximity. Alternatively, or in addition, the adjacent DFBs may be reverse biased so that the adjacent lasers break down and generate heat.

Accordingly, the present invention provides a system and methodology for heating elements on laser sections for high speed tuning. Although this invention has been described in certain specific embodiments, many additional modifications and variations would be apparent to one skilled in the art. It is therefore to be understood that this invention may be practiced otherwise than is specifically described. Thus, the present embodiments of the invention should be considered in all respects as illustrative and not restrictive. The scope of the invention to be indicated by the appended claims, their equivalents, and claims supported by the specification rather than the foregoing description.

What is claimed is:

1. A thermally tuned laser array comprising:
   an array of lasers, each laser comprising:
      a substrate, a waveguide, and an active region in the waveguide;
      an electrical contact coupled to the substrate, the substrate being at a substrate potential;
      a resistive element in thermal contact with the waveguide;
      a first electrical contact coupled to the resistive element and the waveguide, whereby application of a first potential to the first electrical contact causes the laser to lase; and
      the resistive element, being coupled to a second electrical contact, whereby application of a second potential to the second electrical contact causes a current to flow between the first electrical contact and the second electrical contact, thereby heating the laser.

2. The thermally tuned laser array of claim 1 wherein a dielectric separates the resistive element and the waveguide.

3. The thermally tuned laser array of claim 2 wherein the dielectric separates the resistive element and the waveguide at locations other than substantially about the first electrical contact.

4. The thermally tuned laser array of claim 3 wherein the waveguide is formed of a ridged InP cladding layer containing a grating.

5. The thermally tuned laser array of claim 4 wherein the ridged InP cladding layer has a top surface, with the resistive element in thermal contact with the top surface.

6. The thermally tuned laser array of claim 5 further comprising a thermoelectric (TE) cooler thermally coupled to the substrate.

7. The thermally tuned laser array of claim 6 wherein at least some of the lasers in the array of lasers lase at different wavelengths.

8. The thermally tuned laser array of claim 7 wherein each resistive element is coupled to the same second electrical contact so as to be tied to the same potential.

9. A method of thermally tuning a thermally tuned laser array, each laser of the laser array having a resistive element atop each laser and a substrate, the method comprising:
   forward biasing a selected laser, the forward biasing placing at least a portion of the resistive element for the selected laser at a potential above the substrate, the forward biasing causing the selected laser to emit light; and
   generating a current in the resistive element for the selected laser by placing at least a second portion of the resistive element at a potential different than the potential above the substrate, whereby heat is produced in the resistive element.

10. The method of claim 9 wherein the substrate is at a substrate potential, and the difference between the substrate potential and the potential above the substrate is significantly greater than the difference between the potential above the substrate and the potential different than the potential above the substrate.

11. A thermally tuned laser array comprising:
   an array of lasers on a substrate;
   means for providing a drive signal to lasers making up the array of lasers;
   means for providing a heating signal to lasers making up the array of lasers via a single heater contact coupling each laser in the array of lasers, the heating signal and the drive signal in conjunction resulting in heating of a selected laser in the array of lasers.

12. The thermally tuned laser array of claim 1, wherein the second electrical contact is coupled to the resistive element of each laser in the array of lasers.

13. The thermally tuned laser array of claim 2 further comprising a metal layer under the dielectric, the second metal layer being coupled to the waveguide and the first electrical contact.

14. The thermally tuned laser array of claim 1, wherein the resistive element comprises a metal layer.

15. The thermally tuned laser array of claim 1, wherein the resistive element comprises a thin film.

16. The method of claim 9 wherein the resistive element comprises a metal layer.

17. The method of claim 9 wherein the resistive element comprises a thin film.

18. The method of claim 9 wherein in each laser, a dielectric separates the resistive element and the laser.

19. The thermally tuned laser array of claim 11 wherein the means for providing a heating signal applies the heating signal to all of the lasers in the array of lasers.

20. The thermally tuned laser array of claim 11 wherein the heating signal allows current to flow only through lasers in the array of lasers receiving the drive signal, and reverse biases lasers in the array of lasers not receiving the drive signal.

21. The thermally tuned laser array of claim 1 wherein the first potential is greater than the substrate potential and the second potential is less than the first potential.

22. The thermally tuned laser array of claim 21 wherein the second potential is less than the substrate potential.

23. The thermally tuned laser array of claim 8 wherein the first potential is greater than the substrate potential and the second potential is less than the first potential.

24. The thermally tuned laser array of claim 23 wherein the second potential is less than the substrate potential.

25. The method of claim 9 wherein generating a current in the resistive element for the selected laser by placing at least a second portion of the resistive element at a potential different than the potential above the substrate comprises placing an electrical contact coupled to second portions of resistive elements of each laser at a potential different than the potential above the substrate.

26. The method of claim 25 wherein the substrate is at a substrate potential, and the potential different than the potential above the substrate comprises a potential lower than the substrate potential, whereby lasers in the array of lasers other than the selected laser are reverse-biased.

* * * * *